United States Patent
He et al.

(10) Patent No.: US 6,620,651 B2
(45) Date of Patent: Sep. 16, 2003

(54) ADHESIVE WAFERS FOR DIE ATTACH APPLICATION

(75) Inventors: Xiping He, Cerritos, CA (US); Christopher J. Dominic, Santa Ana, CA (US)

(73) Assignee: National Starch and Chemical Investment Holding Corporation, New Castle, DE (US)

(*) Notice: Subject to any disclaimer, the term of this patent is extended or adjusted under 35 U.S.C. 154(b) by 52 days.

(21) Appl. No.: 10/040,674

(22) Filed: Oct. 23, 2001

(65) Prior Publication Data

US 2003/0087479 A1 May 8, 2003

(51) Int. Cl.[7] ............................. H01L 2/44; H01L 21/48
(52) U.S. Cl. ...................................... 438/113; 438/464
(58) Field of Search .................... 438/113, 114, 438/460, 464, 109, 118

(56) References Cited

U.S. PATENT DOCUMENTS

| | | |
|---|---|---|
| 4,199,645 A | 4/1980 | Schwarz |
| 4,874,721 A | 10/1989 | Kimura et al. |
| 5,286,679 A | 2/1994 | Farnworth et al. |
| 5,323,060 A | 6/1994 | Fogal et al. ............... 257/777 |
| 5,411,921 A | 5/1995 | Negoro |
| 5,548,160 A | 8/1996 | Corbett et al. ............ 257/666 |
| 5,564,181 A | 10/1996 | Dineen et al. ............... 29/841 |
| 5,600,183 A | 2/1997 | Gates, Jr. ................. 257/783 |
| 5,656,551 A | 8/1997 | Corbett et al. ............. 156/291 |
| 5,776,799 A | 7/1998 | Song et al. |
| 5,945,733 A | 8/1999 | Corbett et al. ............ 257/676 |
| 5,960,260 A | 9/1999 | Umehara et al. |
| 6,046,072 A | 4/2000 | Matsuura et al. ......... 438/118 |
| 6,124,151 A | 9/2000 | Jiang et al. ............... 438/125 |
| 6,175,149 B1 | 1/2001 | Akram ..................... 257/676 |
| 6,175,162 B1 | 1/2001 | Kao et al. |
| 6,212,767 B1 | 4/2001 | Tandy ........................ 29/836 |
| 6,228,687 B1 | 5/2001 | Akram et al. ............. 438/125 |
| 6,514,795 B1 * | 2/2003 | Jiang et al. ............... 438/113 |

FOREIGN PATENT DOCUMENTS

| | | | |
|---|---|---|---|
| EP | 0979852 A2 * | 2/2000 | ........... B28D/5/00 |
| WO | WO 93/23982 | 11/1993 | ........... H05K/7/06 |
| WO | WO 94/15358 | 7/1994 | ........... H01L/21/58 |
| WO | WO 96/32246 | 10/1996 | ........... B30B/13/00 |
| WO | WO 99/48140 | 9/1999 | ........... H01L/21/44 |
| WO | WO 00/77116 A1 | 12/2000 | ............. C09J/7/02 |
| WO | WO 01/39266 A1 | 5/2001 | ........... H01L/21/44 |

* cited by examiner

*Primary Examiner*—Wael Fahmy
*Assistant Examiner*—Hoa B. Trinh
(74) *Attorney, Agent, or Firm*—Jane E. Gennaro

(57) ABSTRACT

Fabrication of a CSP or a stacked chip CSP can be accomplished with an unsupported film adhesive or an adhesive supported on a rigid carrier, using standard die attach equipment constructed for use with a paste adhesive.

3 Claims, 2 Drawing Sheets

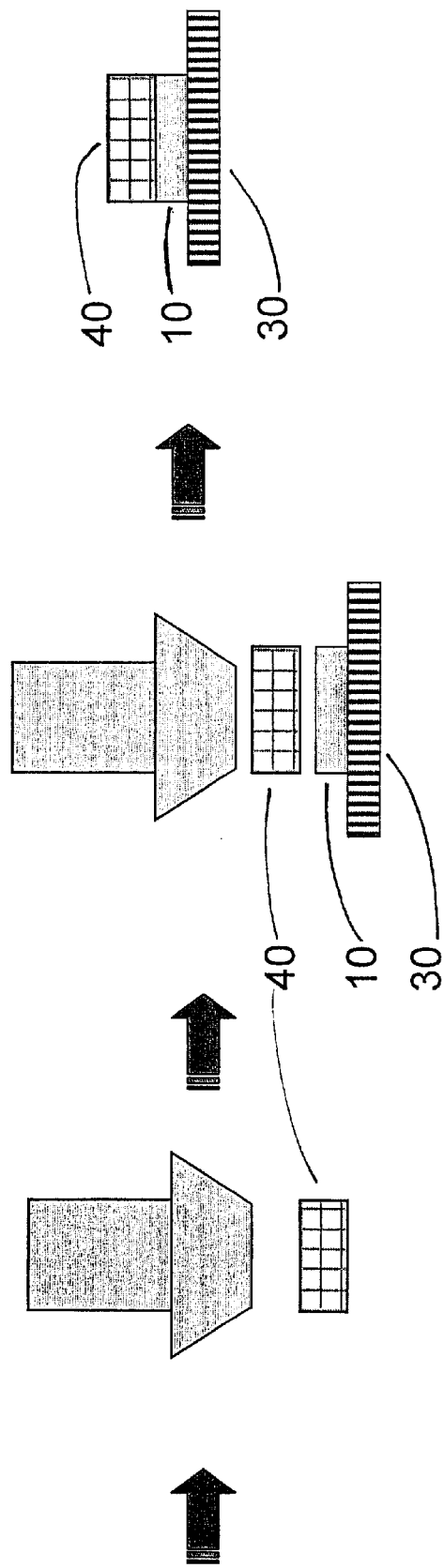

ADHESIVE WAFERS FOR DIE ATTACH APPLICATION

FIELD OF THE INVENTION

This invention relates to an adhesive and bonding method for use in the fabrication of semiconductor packages. It is particularly useful in fabricating Chip Scale and Stacked Die Packages.

BACKGROUND OF THE INVENTION

Chip Scale Packages (CSP) provide the advantages of light weight, small footprint, high density, and enhanced electrical performance in semiconductor packaging. A CSP that includes one or more integrated semiconductor chips stacked one onto another further enhances electrical performance, and reduces space and weight.

Semiconductors are mechanically and electrically connected to a substrate, which in turn is connected to other devices or an outside power source. The substrate can be rigid, such as a metal leadframe, a ceramic or a laminate, or it can be flexible, such as a polyimide tape.

One method of connecting a semiconductor to its substrate is known as wire-bonding, in which the semiconductor chip first is adhered to the substrate with a paste or film adhesive, and then the active terminals on the chip are bonded to active terminals on the substrate with a fine metal wire.

Historically, paste adhesives have been used more often than film adhesives. However, some CSPs are more successfully fabricated using film adhesives because the films can be more precisely fitted to the chip configuration (x-y tolerance), there is minimal or no bleeding of adhesive, and bondline thickness and bondline tilt are more easily controlled.

However, the film process and equipment add cost and increase process time in producing chip scale and stacked chip scale packages. Semiconductor components are placed on their appropriate substrate using placement machines, commonly referred to as "pick-and-place" equipment. This equipment is important for placing components reliably and accurately enough to meet throughput requirements in a cost-efficient way.

In one method of fabricating a CSP using film adhesive, a decal is cut from the film, picked-up and placed onto the substrate, and laminated with pressure and heat. A semiconductor chip is then picked-up and placed onto the adhesive, and laminated to the adhesive with pressure and/or heat. In addition to the pick-and-place equipment, this method requires special film handling and laminating equipment.

In another method using a film adhesive, a decal is punched and laminated onto the substrate using pressure and/or heat, then a semiconductor chip is picked up and placed onto the adhesive and laminated to the adhesive with pressure and/or heat. This method requires a separate punch set for each shape of decal desired, and special punch and film laminating equipment.

Stacked chip CSPs can also be fabricated using the two methods and equipment above, although the required film materials may need to be different in thickness and exhibit different flow characterisitcs. The process for stacked chips entails picking-up and placing a decal of the film adhesive on the substrate, applying heat and pressure, picking-up and placing the die onto the adhesive, and applying heat and pressure. The process is repeated, but in this instance the decal of adhesive is placed on top of the first (mother) chip and laminated, followed by placement of a second (daughter) chip of the same or different geometry onto the mother chip. The daughter chip is then laminated. Typically, special film laminating equipment may be required for both mother and daughter chip placement and lamination.

In another method, an adhesive film is laminated directly to the backside of the semiconductor wafer, which is then diced into individual dies (singulation) using typical wafer dicing equipment. The adhesive remains laminated to the individual die and the die is now picked up and placed onto the substrate, or another die in the case of die stacking. The die is laminated to the substrate or first die with pressure and/or heat. This method requires special film laminating equipment as well as special film die bonding equipment.

Despite the advantages of film adhesive for CSPs and stacked chip CSPs, there is a relatively significant sector of the semiconductor packaging industry that prefers the process and equipment used for the application of paste adhesives, due to the lower cost, ease of use, and availability of this equipment within the industry.

Standard pick and place equipment for using paste adhesive to bond a semiconductor chip to a substrate first dispenses a paste adhesive onto a substrate, then picks-up a chip and places the chip onto the adhesive. The placement stage on which the substrate rests during placement may or may not be heated, but pressure applied by the pick and place tool can be used to optimize the quality of the die attach. This type of equipment normally does not possess post lamination capability and currently is less expensive than the equipment needed for using film.

The potential for using the pick-and-place, heating, and pressure components of this type of equipment to produce semiconductor packages, either with a single chip or stacked chips, with film adhesives would be an advantage in time and cost. The expensive punch sets and laminating components are avoided, and the operation itself takes less time. Moreover, a typical semiconductor packaging process requires wafer dicing capabilities, and with the proper choice of physical properties in a film, the dicing equipment could be used to dice the film adhesive into the appropriate configuration.

SUMMARY OF THE INVENTION

It has now been found that fabrication of a CSP or a stacked chip CSP can be accomplished with an unsupported film adhesive or an adhesive supported on a rigid carrier, using standard die attach equipment constructed for use with a paste adhesive. This invention is a method for fabricating a semiconductor using an unsupported film adhesive or an adhesive supported on a rigid carrier.

BRIEF DESCRIPTION OF THE DRAWINGS

FIG. 2 depicts a semiconductor die, which is picked up, placed onto the adhesive on the substrate, and laminated to the adhesive.

DETAILED DESCRIPTION OF THE INVENTION

Figure 1:
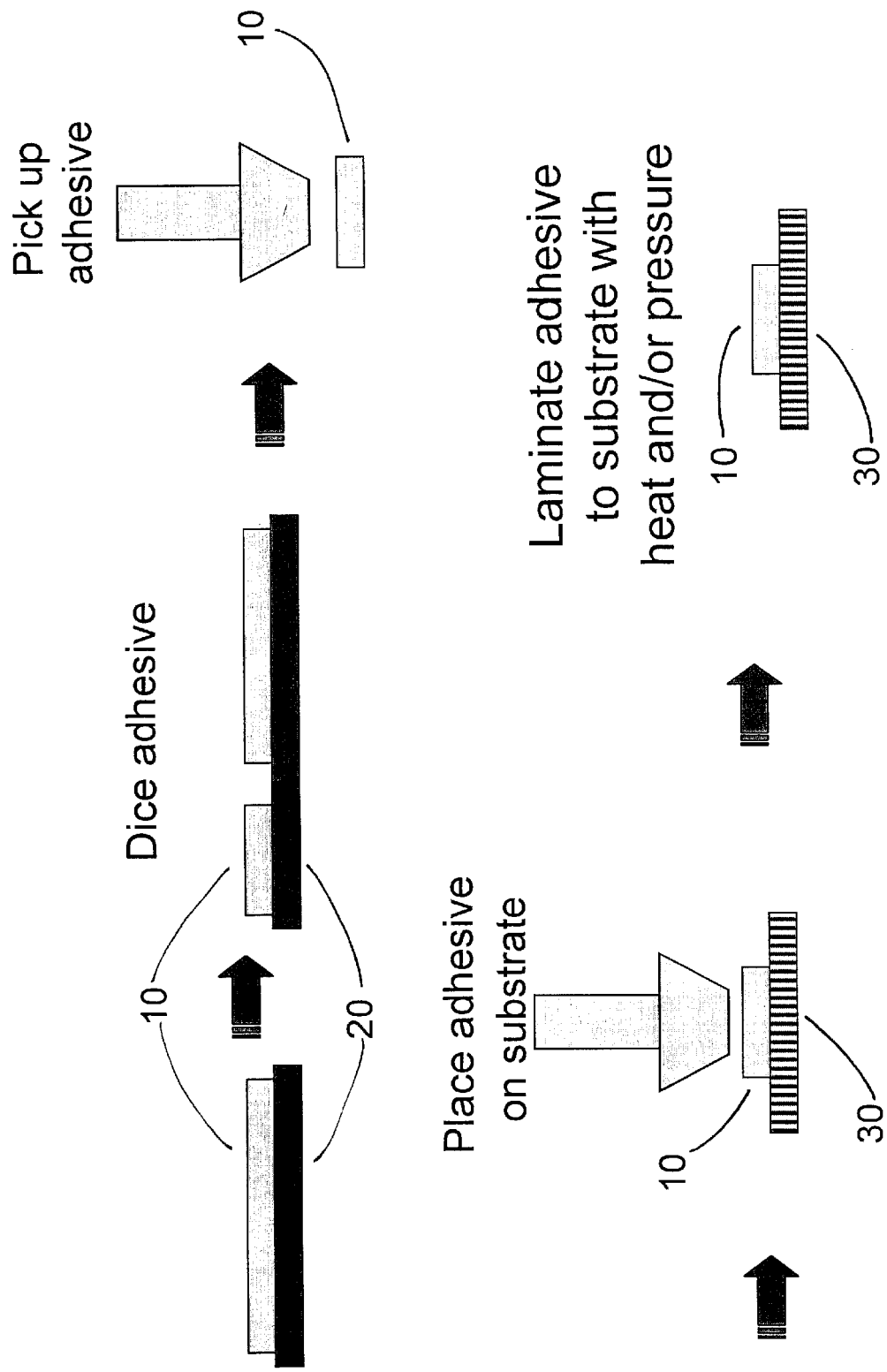
FIG. 1 depicts an adhesive (10) on a wafer dicing tape (20), in which the adhesive is diced, picked up and placed on a substrate, and laminated to the substrate.

The unsupported adhesive can be any thermoplastic, thermoset, or combination of thermoplastic and thermoset adhesive having a modulus higher than 120 MPa and adhesion to a wafer dicing tape of less than 0.1 MPa. Suitable adhesives are epoxies, cyanate esters, polyimides, siloxane polyimides, maleimides, silicones or any combination of those.

The supported adhesive consists of a rigid carrier layer coated on one or both sides with a thermoplastic or thermoset adhesive that exhibits less than 0.1 MPa adhesion to wafer dicing tape. If both sides are coated, the adhesive may be the same or a different composition on each side. The presence of the rigid layer facilitates handling during cutting and pick-and-place and also acts as a spacer in cases where especially thick and controlled distances are required between the two bonded surfaces.

The rigid carrier can be an inorganic material such as ceramic, silicon or metal, or an organic material such as polyimide or polyester, or any combination of inorganic and organic materials such as FR- and BT laminate board provided that the overall composite exhibits a modulus of 120 MPa and less than 0.1 MPa adhesion to dicing tape.

Within these physical parameters, the adhesive, either supported or unsupported can be handled by standard equipment used to handle a semiconductor wafer, such as, an applicator for wafer dicing tape, a dicing saw, and pick-and-place equipment (die bonder with heater block). The adhesive is applied to wafer dicing tape using standard wafer dicing tape lamination equipment. Then the adhesive is sawed into individual decals, in the same process that a silicon wafer is diced. (This method has an advantage over the wafer backside lamination method since excess handling and the lamination of very thin, brittle wafers is avoided.)

The adhesive attach is performed in the same manner as a die attach using a typical paste bonder. The adhesive decal is picked-up from the wafer dicing tape and placed onto the chosen substrate and is laminated to the substrate using pressure and/or heat. A semiconductor die is then picked-up and placed onto the adhesive and laminated using pressure and/or heat.

For stacked chip scale packages, the procedure is repeated using the prior adhered semiconductor chip as the substrate as many times as needed for the number of semiconductor dies to be stacked together.

In the following Examples 1 and 2, the film adhesive had a modulus higher than 120 MPa and adhesion to the wafer dicing tape of less than 0.1 MPa. The carrier in Example 3 did not meet these criteria.

EXAMPLE 1

A film thermoset epoxy adhesive (RP571-10 from Ablestik Laboratories), provided as 12 in×12 in×2 mil thickness sheet, was laminated onto both sides of BT laminate board (Mitsubishi Gas Chemical Company, Inc. 8 in×8 in×8 mil thickness) using lamination equipment under the following conditions:

| | |
|---|---|
| speed: | 30.5 cm/min. |
| temperature: | 135° F. |
| pressure: | 40 psi |

The laminated adhesive was then mounted onto dicing tape (Nitto SPV224) and diced into 4 mm×6 mm decals using a Disco DAD 320 dicing machine set to the following parameters:

| | |
|---|---|
| blade: | NBC-ZH27HEEE |
| spindle speed: | 30,000 rpm |
| feed rate: | 2.54 cm/second |
| cut mode: | down cutting |

The diced adhesive was tested for ability to be processed with an ESEC Die Bonder 2007 LOC die bonder with pick-and-place capability set over two trials to the following parameters:

| Trial | #1 | #2 |
|---|---|---|
| pick-up z-height (mil) | 177 | 177 |
| pick-up time (millisec) | 50 | 50 |
| foil touch time (millisec) | 60 | 0 |
| needle top height (mil) | 45 | 45 |
| ejector height offset (mil) | 9.8 | 9.8 |
| needle velocity (mm/s) | 30 | 30 |
| success times/trial times | 10/10 | 10/10 |

The test was tried ten times for each of two foil touch times, and was successful ten times for each of the two foil touch times. This example shows that the adhesive is capable of being picked off the wafer dicing tape using standard pick-and-place equipment.

EXAMPLE 2

A single layer polyethylene (America Plastic, 30.48 cm×30.48 cm×3 mil thickness) was mounted onto Nitto SPV-224 dicing tape and diced into 4 mm×6 mm size using a Disco DAD 320 dicer, with a NBC-ZH 27HEEE blade, spindle speed of 30,000 rpm, and a feed rate 2.54 cm/sec. The dicing conditions are:

| | | |
|---|---|---|
| cut mode | | A |
| cut shape | | square |
| spindle speed | | 32,000 rpm |
| work thickness | | 7 mils |
| tape thickness | | 3 mil |
| blade height | | 2 mil |
| feed speed | | 0.5 cm/sec |
| Y index | CH1 | 0.4 cm |
| | CH2 | 0.6 cm |

The diced polyethylene was tested for ability to be processed with an ESEC Die Bonder 2007 LOC with pick-and-place capability set to the following parameters:

| | |
|---|---|
| pickup z height (mm) | 6.00 to 5.52 |
| pickup time (millisec) | 600 to 6000 |
| foil touch time (millisec) | 200 |
| needle top height (mm) | 0 to 1.80 |
| ejector height offset (mm) | 0 |
| needle velocity (mm/s) | 30 to 110 |
| bondarm state | park position |
| ejector state | calibrate height |
| needle state | bottom position |
| bond arm z pos (mm) | 2.17 |
| chip thickness (mm) | 0.17 |
| needle type | rounded head |
| success time/trial times | 10/10 |

EXAMPLE 3

The same test was run as in Example 2, except that the substrate material was a 5 mil silicone. Pick-up failed ten out of ten times.

What is claimed:

1. A method of fabricating a semiconductor package in which a semiconductor die is adhered to a substrate with an adhesive film, the method comprising:
   a. providing a film adhesive on a wafer dicing tape in which the film adhesive has a modulus higher than 120 MPa and adhesion to the wafer dicing tape of less than 0.1 Mpa;
   b. dicing the film adhesive on the wafer dicing tape into a decal;
   c. picking-up the adhesive decal from the dicing tape and placing the adhesive decal onto a substrate;
   d. laminating the adhesive decal to the substrate using pressure and/or heat;
   e. picking-up and placing a semiconductor die onto the adhesive; and
   f. laminating the die onto the adhesive using pressure and/or heat.

2. A method of fabricating a semiconductor package in which a number of semiconductor dies are stacked together, the method comprising first performing the method of claim 1 and then repeating the method of claim 1 using the prior adhered semiconductor die as the substrate as many times as needed for the number of semiconductor dies to be stacked together.

3. The method according to claim 1 or 2 in which the film adhesive is an unsupported thermoplastic or thermoset film, or a thermoplastic or thermoset film supported on a rigid carrier.

* * * * *